United States Patent [19]

Huang

[11] Patent Number: 5,665,988

[45] Date of Patent: Sep. 9, 1997

[54] CONDUCTIVITY-MODULATION SEMICONDUCTOR

[75] Inventor: Qin Huang, Blacksburg, Va.

[73] Assignee: Fuji Electric Co., Ltd., Kawasaki, Japan

[21] Appl. No.: 721,939

[22] Filed: Sep. 27, 1996

Related U.S. Application Data

[63] Continuation of Ser. No. 385,769, Feb. 9, 1995, abandoned.

[51] Int. Cl.$^6$ .......................... H01L 29/74; H01L 31/111; H01L 23/58; H01L 29/76
[52] U.S. Cl. .......................... 257/133; 257/212; 257/337
[58] Field of Search .......................... 257/133, 212, 257/337

[56] References Cited

U.S. PATENT DOCUMENTS

| | | |
|---|---|---|
| 4,364,073 | 12/1982 | Becke et al. . |
| 4,901,127 | 2/1990 | Chow et al. .......................... 257/80 |
| 4,949,142 | 8/1990 | Contiero . |
| 5,060,032 | 10/1991 | Ogawa et al. .......................... 257/80 |
| 5,198,688 | 3/1993 | Tsuchiya et al. .......................... 257/144 |
| 5,245,202 | 9/1993 | Yasukazu .......................... 257/133 |

FOREIGN PATENT DOCUMENTS

| | | |
|---|---|---|
| 0559910A1 | 9/1993 | European Pat. Off. . |
| 2173037 | 10/1986 | United Kingdom . |

*Primary Examiner*—Stephen Meier
*Attorney, Agent, or Firm*—Morrison Law Firm

[57] ABSTRACT

A plurality of minority carriers, which cause a conductivity modulation effect in a semiconductor device, are supplied from a separately disposed minority carrier injection region which is alternately connected to and separated from a drain region. The minority carriers are injected via the minority carrier injection region connected to the drain region during forward biasing. The minority carrier injection is stopped by separating the injection region from the drain region when the turn-off operation begins. This operation reduces the carriers that need to be swept off during a turn-off operation. The turn-off time is shortened in a bipolar semiconductor device, such as an IGBT with a reduced on-voltage, by utilizing the conductivity modulation to reduce switching loss.

12 Claims, 5 Drawing Sheets

CONDUCTIVITY-MODULATION SEMICONDUCTOR

This application is a continuation of application Ser. No. 08/385,769, filed Feb. 9, 1995, now abandoned.

BACKGROUND OF THE INVENTION

The present invention relates to semiconductor devices, and in particular, to a semiconductor device with a conductivity modulation effect which is used as a semiconductor switching element in power converters and power controllers.

Most solid-state devices are inherently unilateral since they are designed to carry current in only one direction, known as the forward direction. Appreciable current flow in the reverse direction is blocked, although a brief transient of reverse current flows when reverse voltage is applied. Most solid-state switches open automatically when reverse polarity is applied across their terminals.

Switch devices come in three types. The first type is a two-terminal switch which automatically closes when forward polarity is applied and opens when reverse polarity is applied. Such devices are known as rectifier diodes or diodes. The second type of switch has an added control terminal. This type of switch blocks forward current until a turn-on pulse is applied to the control terminal. This switch continues to conduct as long as forward current flows. The control electrode cannot interrupt the forward current flow. Such devices are known as reverse-blocking triode thyristors, thyristors, or silicon controlled rectifiers (SCR's).

The third type of switch is similar to the second type except that it includes turnoff ability. That is, forward current can be interrupted by the control electrode. This type includes switching transistors because collector current ceased when the control signal is removed from the base. Bistable switches of this type are known as turnoff thyristors or gate-controlled switches. The present invention relates to this third type of switch.

Power semiconductor devices, which mainly carry out switching operations in power converters and power controllers, must have a small turn-on voltage drop in order to keep power loss to a minimum. Thyristors with a conductivity modulation effect and insulated gate bipolar transistors (hereinafter abbreviated to IGBT) are commonly used in applications that require a high blocking voltage. Conductivity modulation is defined as the variation of the conductivity of a semiconductor by varying the charge-carrier density.

The lateral structure shown in the prior art of FIG. 2 is suitable for incorporating a plurality of IGBT's in an integrated circuit. The IGBT's are built into a surface layer of an epitaxial $n^-$ layer 2 with a high-resistance factor grown on a $p^-$ silicon substrate 1. The IGBT's are formed on a chip 10 in the integrated circuit by producing more than two unit constructions $U_h$ as shown in FIG. 2, and connecting units $U_h$ in parallel. This unit construction $U_h$ is repeated symmetrically in the horizontal direction in FIG. 2. On the left side of FIG. 2, a p-type base region 3 is formed by diffusing impurities from a surface of $n^-$ layer 2, upon which an $n^+$ emitter layer 4 is formed sandwiching a $p^+$ contract region 31. A first gate electrode 51 on a gate oxide film 52 is connected to a gate terminal G. Gate terminal G is on a surface of a part of p-type base region 3 that is between $n^-$ layer 2 and $n^+$ emitter region 4. In addition, an emitter electrode 61 connected to a first main terminal T1 contacts both emitter region 4 and contact region 31. On the right side of FIG. 2, a $p^+$ drain region 7 surrounded by an n-type buffer region 21 is formed by diffusing impurities from the surface of $n^-$ layer 2 in the same manner as described above. A collector electrode 62 connected to a second main terminal T2 contacts drain region 7.

In this horizontal type IGBT, p-type base region 3, $n^-$ layer 2 and $p^+$ drain region 7 constitute one PNP transistor. This bipolar transistor is turned on and off by controlling the potential of first gate electrode 51 that injects a base current into $n^-$ layer 2, which acts as the base of the transistor. That is, when positive voltage is applied from gate terminal G into gate 51, a plurality of electrons e, the majority carrier, flow into $n^-$ layer 2 from emitter region 4 via an n-type inversion layer (not shown) formed on a surface of p-type base region 3 directly below gate 51, thereby creating conduction between main terminals T1 and T2 of the IGBT.

Furthermore, because a plurality of holes h, the minority carrier, are injected into $n^-$ layer 2 from $p^+$ drain region 7 via buffer region 21 by the base current after the conduction between main terminals T1 and T2 is created, the conductivity modulating action reduces the on-voltage between main terminals T1 and T2. The on-voltage is thus lower than in an ordinary MOSFET. This IGBT may be turned off by stopping the injection of majority carrier e into $n^-$ layer 2 by turning the voltage at gate 51 off. A depletion layer extends to $n^-$ layer 2 after the device is turned off to create a high reverse voltage blocking condition.

A horizontal MOS controlled thyristor (hereinafter referred to as the MCT) according to the prior art, shown in FIG. 3, is controlled by a MOS gate. A $p^+$ emitter region 41 is formed on a surface of an n-type base region 32, which itself is on a surface of a p-type base region 3. An emitter electrode 61 contacts both $p^+$ emitter region 41 and n-type base layer 32. A gate 51, on a gate oxide film 52, is disposed on the surface of n-type base 32 and p-type base 3 in a region sandwiched between $n^-$ layer 2 and $p^+$ emitter region 41. When a positive voltage is applied from gate terminal G into gate 51, electrons (not shown) flow into $n^-$ layer 2 from n-type base region 32 via an n-type inversion layer (not shown) formed on a surface of p-type base region 3 directly below gate 51. Conduction is thereby created between main terminals T1 and T2, causing conductivity modulation as in the case of the IGBT. When the thyristor is turned off, a negative voltage is applied to gate 51. As a result, an n-channel on the surface of p-type base region 3 is closed while a p-channel is formed on the surface of n-type base region 32 directly below gate 51. Therefore, p-type base region 3 is shorted with emitter electrode 61 via $p^+$ emitter region 41, and the thyristor is turned off.

As described above, the IGBT has an advantage in that it is turned on and off and controlled easily through insulating gate 51 which has a high input impedance. When the IGBT is on, the on-voltage is reduced by the conductivity modulation effect in $n^-$ layer 2. However, the excessive carriers that contribute to conductivity modulation when the device is on must be swept away to expand the depletion layer when the device is turned off. This causes a problem because a lot of time is consumed in removing the carriers, substantially prolonging the turn-off time and increasing the turn-off loss. This increase in turn-off loss is a major obstacle to using the IGBT in a high-frequency circuit requiting high-speed on/off operations.

The turn-off loss noticeably increases when driving an inductive load, which generates a counter electromotive force following extension of the depletion layer during turn-off. The extension of the depletion layer causes a sweeping out of majority carriers that acts as a base current of the PNP transistor and leads to an injection of the minority carriers to maintain the current for an inductive load. The constant current and large counter electromotive force simultaneously applied to the device increases the turn-off loss. To improve such turn-off characteristics, minority carriers injected from drain region 7 into n⁻ layer 2 during a turn-on operation may be reduced by raising the concentration of impurities in buffer region 21. However, this action has its limits because it has a negative effect on the conductivity modulation during operation in the on-state. It is also possible to shorten the carrier life time to accelerate recombination of the carriers by diffusing heavy metals such as gold and platinum into the region, since these are so-called carrier life time killers. However, this technique has the negative effect of increasing the on-voltage. The problems described above occur in both the IGBT and the MCT.

OBJECTS AND SUMMARY OF THE INVENTION

An object of the present invention is to overcome the limitations and drawbacks of the prior art.

Another object of the invention is to provide a semiconductor device that improves the turn-off characteristics without adversely affecting the forward-direction characteristics.

A further object of the invention is to shorten the turn-off time in a bipolar semiconductor device and reduce the on-voltage by utilizing conductivity modulation to reduce switching loss.

Briefly stated, a plurality of minority carriers, which cause a conductivity modulation effect in a semiconductor device, are supplied from a separately disposed minority carrier injection region which is alternately connected to and separated from a drain region. The minority carriers are injected via the minority carrier injection region connected to the drain region during forward biasing. The minority carrier injection is stopped by separating the injection region from the drain region when the turn-off operation begins. This operation reduces the carriers that need to be swept off during a turn-off operation. The turn-off time is shortened in a bipolar semiconductor device, such as an IGBT with a reduced on-voltage, by utilizing the conductivity modulation to reduce switching loss.

According to an embodiment of the invention, a semiconductor device includes a first layer of a first conductivity type on a second layer of a second conductivity type, the first layer having a high resistance, a drain region of the first conductivity type in a first surface region of the first layer, the drain region having a low resistance, a first electrode formed on a surface of the drain region, a minority carrier injection region of the second conductivity type formed in a second surface region of the first layer, means for injecting a plurality of minority carriers into the first layer, a source region of the first conductivity type formed in a first surface region of the minority carrier injection region, and a short-circuit electrode partly on a surface of the minority carrier injection region and partly on a surface of the source region.

According to an embodiment of the invention, a semiconductor device includes a first layer of a first conductivity type on a second layer of a second conductivity type, the first layer having a high resistance, a drain region of the first conductivity type in a first surface region of the first layer, the drain region having a low resistance, a first main electrode formed on a surface of the drain region, a minority carrier injection region of the second conductivity type formed in a second surface region of the first layer, means for injecting a plurality of minority carriers into the first layer, a source region of the first conductivity type formed in a first surface region of the minority carrier injection region, a short-circuit electrode partly on a second surface region of the minority carrier injection region and partly on a surface of the source region, a base region of the second conductivity type in a third surface region of the first layer, an emitter region of the first conductivity type in a surface region of the base region, a second main electrode on a surface of the base region and the emitter region, a first gate oxide film disposed on a surface of the base region between the emitter region and the first layer, a first gate electrode on the first gate oxide film, a second gate oxide film disposed on a third surface region of the minority carrier injection region between the source region and the drain region, and a second gate electrode on the second gate oxide film, According to an embodiment of the invention, a semiconductor device includes a first layer of a first conductivity type on a second layer of a second conductivity type, the first layer having a high resistance, a drain region of the first conductivity type in a first surface region of the first layer, the drain region having a low resistance, a first main electrode formed on a surface of the drain region, a minority carrier injection region of the second conductivity type formed in a second surface region of the first layer, means for injecting a plurality of minority carriers into the first layer, a source region of the first conductivity type formed in a first surface region of the minority carrier injection region, a short-circuit electrode partly on a second surface region of the minority carrier injection region and partly on a surface of the source region, a first base region of the second conductivity type in a third surface region of the first layer, a second base region of the first conductivity type in a surface region of the first base region, an emitter region of the second conductivity type in a surface region of the second base region, a second main electrode on a surface of the second base region and the emitter region, a first gate oxide film disposed on a surface of the first base region and the second base region, a first gate electrode on the first gate oxide film, a second gate oxide film disposed on a third surface region of the minority carrier injection region between the source region and the drain region, and a second gate electrode on the second gate oxide film.

According to an embodiment of the invention, a semiconductor device includes a first layer of a first conductivity type on a second layer of a second conductivity type, the first layer having a high resistance, a buffer region of the first conductivity type formed in a first region of the first layer, a minority carrier injection region of the second conductivity type formed in a first area of the buffer region, a punch-through region of the second conductivity type formed in a second area of the buffer region, the punch-through region and the minority carrier injection region being connected, means for injecting a plurality of minority carriers into the first layer, a source region of the first conductivity type formed in a first surface region of the minority carrier injection region, a short-circuit electrode partly on a surface of the minority carrier injection region and partly on a surface of the source region, a drain region of the first conductivity type formed in an area of the punch-through region, and the drain region having a low resistance.

According to an embodiment of the invention, a semiconductor device includes a first layer of a first conductivity type disposed adjacent a second layer of a second conductivity type, the first layer having a high resistance, a drain region of the first conductivity type in a first region of a first surface of the first layer, the drain region having a low resistance, a collector electrode formed on a surface of the drain region, a minority carrier injection region of the second conductivity type formed in a second region of the first surface of the first layer, means for injecting a plurality of minority carriers into the first layer, a source region of the first conductivity type formed in a first surface region of the minority carrier injection region, a short-circuit electrode partly on a second surface region of the minority carrier injection region and partly on a surface of the source region, a base region of the second conductivity type in a third region of a second surface of the first layer, an emitter region of the first conductivity type in a surface region of the base region, an emitter electrode on a surface of the base region and the emitter region, a first gate oxide film disposed on a fourth region of the second surface of the first layer, a first gate electrode on the first gate oxide film, a second gate oxide film disposed on a third surface region of the minority carrier injection region, and a second gate electrode on the second gate oxide film.

In order to achieve the above objects, the present semiconductor device is structured so that one of the main electrodes is formed on the surface of a low-resistance region of the first conductivity type which is itself in contact with a high-resistance region of the first conductivity type, a minority carrier injection region of the second conductivity type is formed, a source region of the first conductivity type is formed on the surface layer of the minority carrier injection region, a gate electrode is disposed via a gate insulation film on the minority carrier injection region at a part sandwiched by an edge close to the main electrode and the source region and an electrode in order to short-circuit the source region and the minority carrier injection region on the surface. The minority carrier injection region may be formed adjoining the low-resistance region of the first conductivity type, or may be formed at a distance from the low-resistance region of the first conductivity type. It is desirable that base regions of the second conductivity type are formed individually on the surface layer of a high-resistance semiconductor layer, emitter regions of the first conductivity type are formed on the surface layer of the base regions, another gate electrode is disposed via the gate insulation film on the surface layer of the base region at a part sandwiched by the emitter region and the high-resistance layer, while the other main electrode contacts the surfaces of the base region and the emitter region. On the other hand, it is also desirable that the base regions of second conductivity type are formed individually on the surface layer of the high-resistance semiconductor layer of the first conductivity type, base regions of first conductivity type are formed on the surface of the base regions of second conductivity type, emitter regions of the second conductivity type are formed on the surface of the base regions of first conductivity type, another gate electrode is disposed via the gate insulation film on the surface layers of the base regions of the first and second conductivity types at a part sandwiched by the high-resistance semiconductor layer of the first conductivity type and the emitter regions, and the other main electrode contacts the surfaces of the base region of the first conductivity type and the emitter region. It is also desirable that a punch-through region of the second conductivity type with a depth greater than that of the low-resistance factor region of the first conductivity type, but smaller than that of the minority carrier injection region, is formed beneath the low-resistance factor region of the first conductivity type. In these cases, the minority carrier injection region and the base region contacting the other electrode may be formed on the surface layer of the same main surface as the main surface on which a low-resistance region of the first conductivity type, which contacts one of the main electrodes of the high-resistance factor semiconductor layer of the first conductivity type, is formed. Alternatively, the minority carrier injection region and base region may be formed on the surface layer of the main surface, which is different from the main surface mentioned above.

It is to be understood that the first conductivity type referred to above may be either n-type or p-type, and the second conductivity type referred to above will then be either p-type or n-type, respectively.

The region in which the minority carrier is injected is separately disposed so that the injection of the minority carrier can be controlled by the voltage applied to a minority carrier controlling gate electrode when current caused by the minority carrier flows into the high-resistance factor semiconductor layer. This construction allows both the minority carrier and the majority carrier to be injected in large quantities during an on-state period, so that the conductivity modulation effect reduces the on-voltage, without impeding the conductivity modulation effect, by stopping the minority carrier injection simultaneously at or immediately before the turn-off operation, thereby also reducing the switching loss. Therefore, if such a minority carrier injection region is disposed (in place of a drain region with a conductivity type that is different from that of the high-resistance factor semiconductor layer disposed to achieve conductivity modulation effect in the prior art) an IGBT or an MCT that operates with a low on-voltage and causes a smaller switching loss can be obtained.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 1:
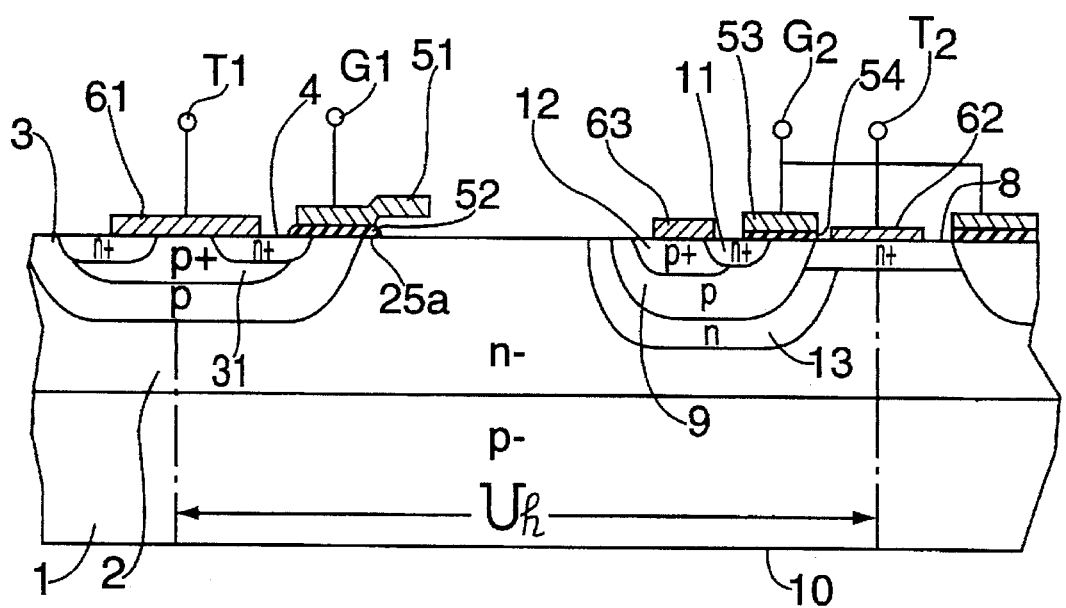
FIG. 1 is cross section of a semiconductor device according to a first embodiment of the present invention having the functions of a horizontal IGBT.
Figure 2:
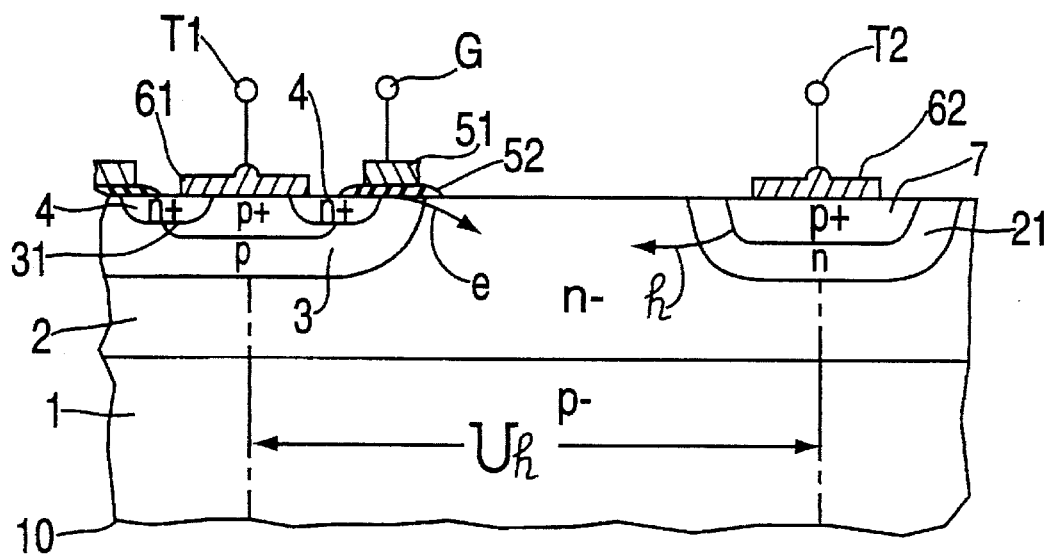
FIG. 2 is a cross section of a horizontal IGBT according to the prior art.

In the first embodiment shown in FIG. 1, an $n^+$ drain region 8 with a collector electrode 62 in contact therewith (as in the case of an ordinary horizontal MOSFET) is formed in place of a p⁺ drain region 7 of a lateral IGBT as shown in FIG. 2. At the same time, a p-type minority carrier injection region 9 for injecting minority carriers, i.e., holes h, into an n⁻ layer 2 is formed near a p-type base region 3 in n⁺ drain region 8. A p⁺ contact region 12 and an n⁺ source region 11 are formed on a surface layer of minority carrier injection region 9. A gate oxide film 54 is disposed on a surface of minority carrier injection region 9 between n⁺ source region 11 and n⁺ drain region 8. A second gate electrode 53, connected to a second gate terminal G2, is disposed on gate oxide film 54. N⁺ source region 11 is connected to minority carrier injection region 9 through p⁺ contact region 12 by a short-circuit electrode 63 in order to make a short circuit. Moreover, an n-type buffer region 13 is formed at an interface of minority carrier injection region 9 and n⁻ layer 2 to prevent punch-through.

The operation of this embodiment is as follows. First, when a voltage larger a gate threshold voltage is applied to first gate terminal G1, an inversion layer is formed on a surface of p-type base region 3 directly below first gate electrode 51. A plurality of electrons (not shown) are injected from n⁺ source region 4 into n⁻ layer 2 via this inversion layer. The injected electrons are attracted by a positive potential applied to T2, and eventually reach drain region 8.

Then, if a potential higher than the threshold value has been applied to second gate electrode 53, an inversion layer (not shown) is formed on a surface of minority carrier injection region 9 directly below second gate electrode 53, connecting n⁺ source region 11 to drain region 8. This causes the positive potential applied to second main terminal T2 to attract the electrons in n⁺ source region 11, which eventually reach drain region 8. While the electrons in n⁺ source region 11 are supplied by short-circuit electrode 63, short-circuit electrode 63 maintains neutrality by simultaneously supplying holes in minority carrier injection region 9. In other words, short-circuit electrode 63 performs electron-hole conversion. As a result, holes h of the minority carrier are injected into n⁻ layer 2 from minority carrier injection region 9, thereby modulating the conductivity as in the lateral IGBT.

On the other hand, if the potential at second gate terminal G2 drops below the threshold voltage, the inversion layer directly below second gate terminal G2 vanishes. The injection of holes h from minority carrier injection region 9 ceases because n⁺ source region 11 enters a floating condition relative to drain region 8. In this case, the minority carriers stored in n⁻ layer 2 as a result of the conductivity modulation are swept away in the direction of p-type base region 3, and finally vanish as a result of a recombination of carriers. If first gate electrode 51 is turned off when excessive carriers have vanished or almost vanished, this device can be turned off at a very high speed, as in the case of a MOSFET.

In addition to the method described above which turns the first and second gates off at different times, it is possible to turn the first and second gates off simultaneously. Although the turn-off speed is slightly reduced in this case because of the presence of excessive carriers, switching loss can be reduced by preventing injection of the minority carrier by sweeping out the electrons associated with the growth of the depletion layer after the first gate has been turned off, as occurs when an inductive load is mined off. The control circuit can be simplified in such a case because the gates are turned off simultaneously.

Figure 4:
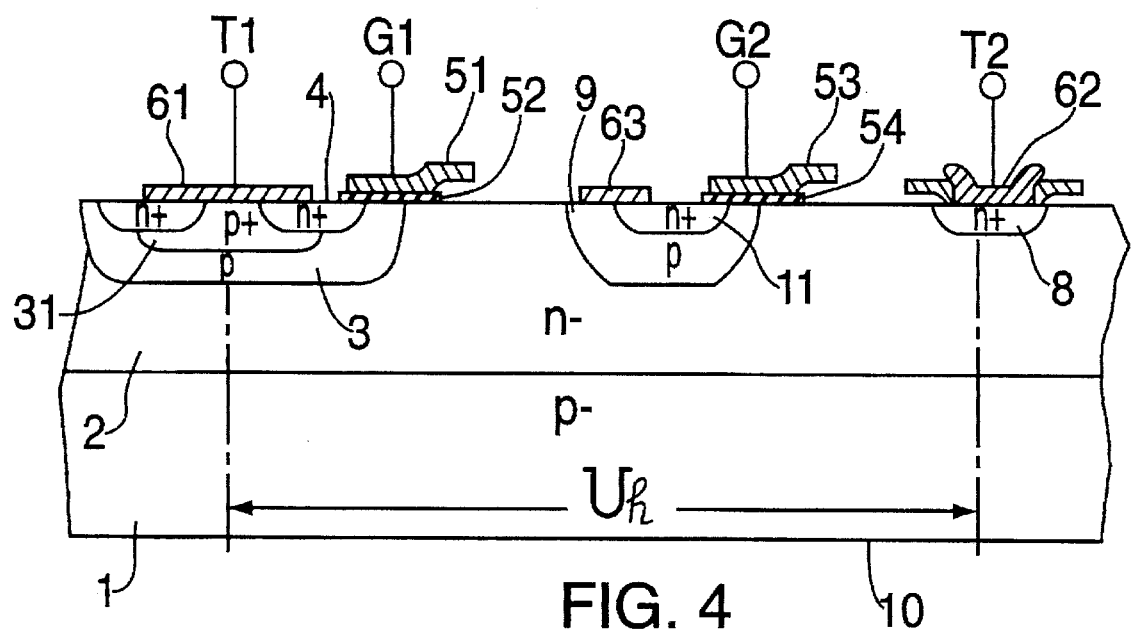
FIG. 4 is a cross section of a semiconductor device according to a second embodiment of the present invention having the functions of a horizontal IGBT.

FIG. 4 shows a second embodiment of the present invention, which differs from the first embodiment in that minority carrier injection region 9 is formed away from drain region 8, n-type buffer region 13 is not present, and second gate electrode 53 is extended toward a drain layer side in order to form a field plate. This embodiment prevents the occurrence of a negative resistance characteristic in the output characteristics, which easily occurs in the first embodiment.

Figure 5:
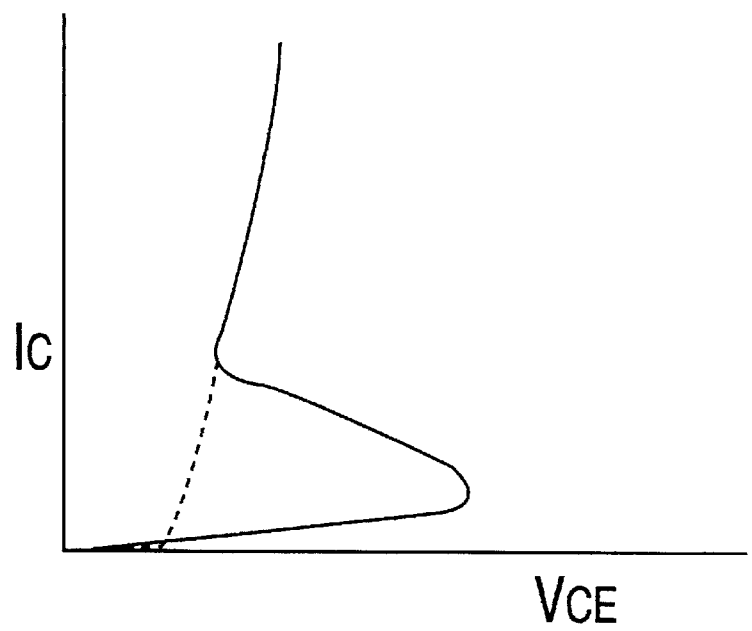
FIG. 5 shows current and voltage characteristic curve charts for the semiconductor devices shown in FIGS. 1 and 4.

This embodiment is explained as follows. In the first embodiment as shown in FIG. 1, an injection of minority carriers from minority carrier injection region 9 occurs only after the electron current has reached a certain value. That is, minority carrier injection occurs for the first time when a p-n junction between minority carrier injection region 9 and n-type buffer region 13 is biased in the forward direction. This is caused by a voltage drop directly below minority carrier injection region 9, which in turn is caused by the electron current flowing when the first gate is turned on. Once minority carrier injection occurs, the current caused by conductivity modulation predominates. As a result, the forward bias value in the junction between minority carrier injection region 9 and n-type buffer region 13 increases. This increase serves to further increase the minority carrier injection, causing the resistance to decrease sharply. The negative resistance is thus generated as shown by the solid line for the I-V characteristic in FIG. 5.

In the second embodiment, since minority carrier injection region 9 is placed away from drain region 8, the voltage drop in n⁻ layer 2 directly below minority carrier injection region 9 is large enough (even if the current is small) to facilitate the injection of minority carriers. Thus, an output characteristic with less negative resistance is obtained. In addition, if a punch-through is caused by the element junction structure, the first embodiment (FIG. 1) must have an n-type buffer layer 13. However, the second embodiment (FIG. 4) eliminates the need for a buffer region even under such circumstances because the remaining withstand voltage can be retained by n⁻ layer 2. N⁻ layer 2 is present between minority carrier injection region 9 and n⁺ drain region 8 even if the depletion layer extending from p-type base region 3 or p⁻ substrate reaches minority carrier injection region 9. The presence of a buffer region 13 (not in FIG. 4) with a low resistance tends to make the voltage drop caused by the electron current smaller while facilitating the negative resistance. However, the second embodiment (FIG. 4) prevents such a trend. Furthermore, extending second gate electrode 53 toward the drain layer side, thereby forming a field plate, causes the depletion layer to grow more easily from minority carrier injection region 9, thereby lowering the intensity of the electric field. Incidentally, the embodiment shown in FIG. 4 has a field plate formed to extend laterally from both sides of a collector electrode 62 of drain region 8.

Figure 3:
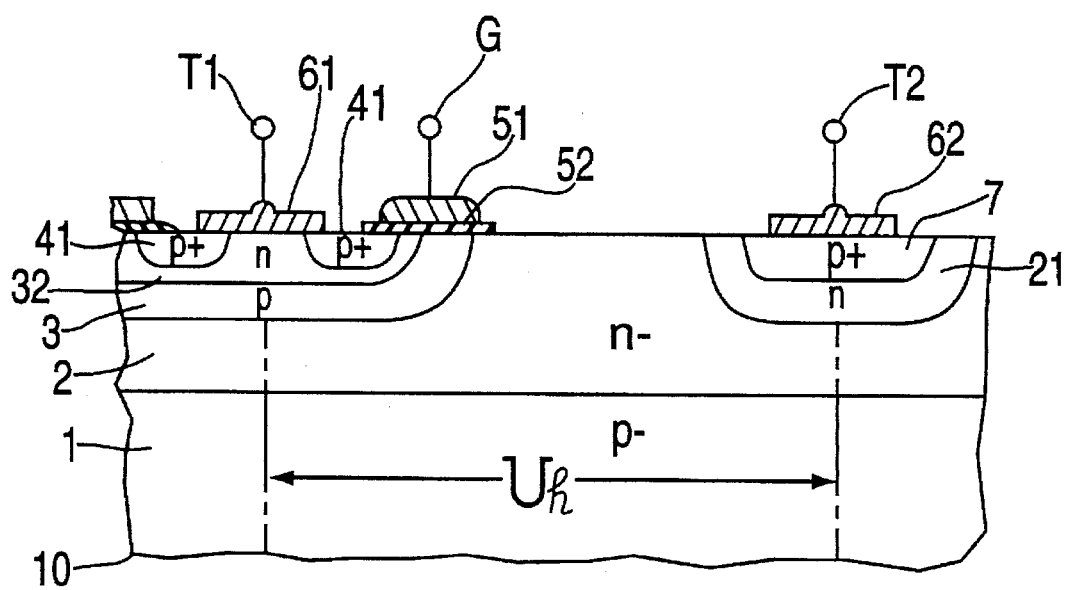
FIG. 3 is a cross section of a horizontal MCT according to the prior art.
Figure 6:
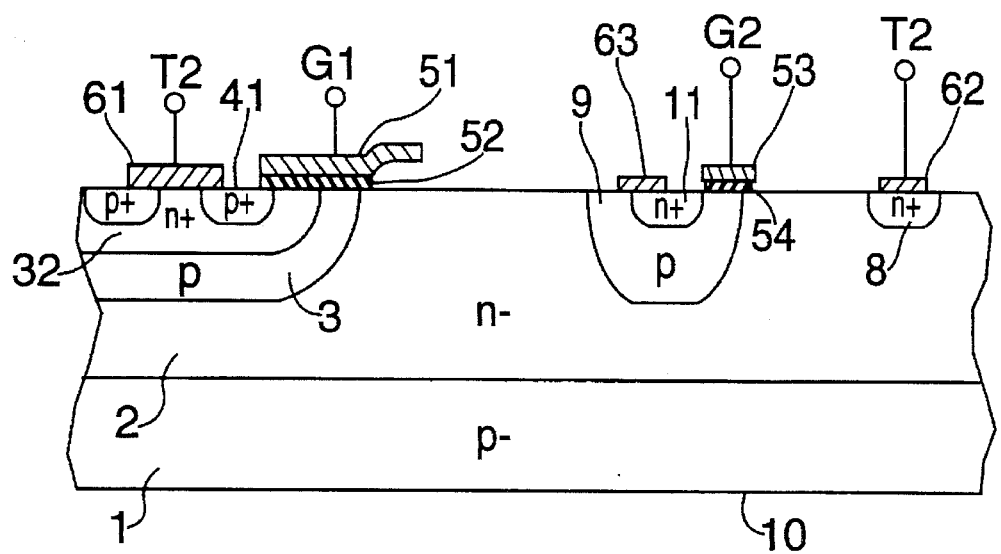
FIG. 6 is a cross section of a semiconductor device according to a third embodiment of the present invention having the functions of a horizontal IGBT.

The third embodiment of the present invention, shown in FIG. 6, is an example of a minority carrier controlled construction applied to a lateral MCT. That is, an area around an emitter electrode 61 is constructed in the same way as the area around the lateral MCT shown in FIG. 3. However, the construction is similar to that shown in the second embodiment (FIG. 4), in that a p⁺ drain region 7 is absent, a collector electrode 62 contacts n⁺ drain region 8, minority carrier injection region 9 is formed between n⁺ drain region 8 and p-type base region 3, and n⁺ source region 11 is formed on a surface of minority carrier injection region 9. This embodiment reduces the on-voltage in a turned-on state and increases the turn-off speed by controlling the injection of the minority carriers, as has already been done in the case of an IGBT. Furthermore, in this embodiment, the deficiencies inherent in the MCT (i.e., that the depletion layer cannot be extended because carriers are present in large numbers, and that the area of the safe operation region is reduced during a turn-off operation) are corrected by stopping minority carrier injection immediately before the turn-off operation.

Figure 8:
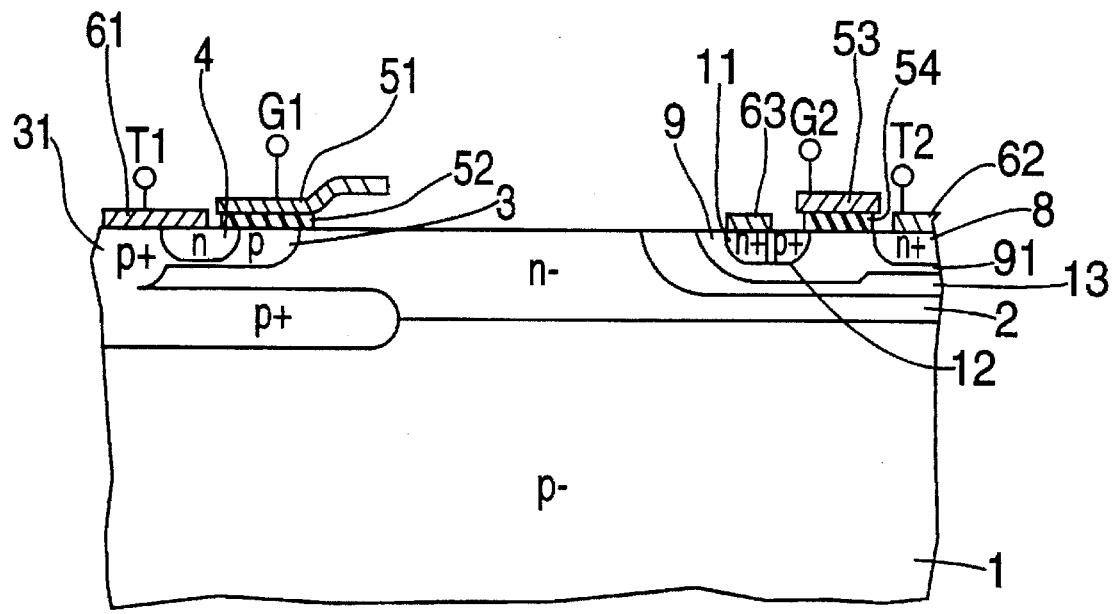
FIG. 8 is a cross section of a semiconductor device according to a fourth embodiment of the present invention having the functions of a horizontal IGBT.

FIG. 8 shows a fourth embodiment of the present invention. The difference between this embodiment and the first embodiment is that a p-type punch-through region 91 is formed surrounding drain region 8 and linked to minority carrier injection region 9. Because drain region 8 is completely surrounded by a p-type region in this embodiment, minority carrier injection is possible even in a low-current region, thereby completely preventing a negative resistance as indicated by the broken lines in the V-I characteristic in FIG. 5. Furthermore, similar to the first embodiment, minority carrier injection is stopped during the turn-off operation of the second gate by the punch-through effect of punch-through region 91. Punch-through region 91 is sufficiently thin to keep the impurity concentration low.

The operation of the fourth embodiment is explained as follows. When the second gate is turned on, only a very slight potential difference is generated between $n^+$ source region 11 and minority carrier injection region 9, since $n^+$ source region 11 and minority carrier injection region 9 are connected by short circuit electrode 63. There is also only a very slight potential difference between punch-through region 91 and drain region 8, since $n^+$ source region 11 is shorted with drain region 8 by an inversion layer directly below second gate electrode 53. Therefore, minority carrier injection can occur via punch-through region 91 in a low current region. However, because punch-through region 91 has a low concentration and a small injection coefficient, a forward voltage across n-type buffer region 13 and minority carrier injection region 9 rises as the current increases, thereby slowly making the injection from minority carrier injection region 9 predominant. No negative resistance is generated since this arrangement continuously increases the injection via the minority current region.

On the other hand, when the second gate is turned off, a current that has been flowing through the inversion layer directly below second gate electrode 53 is interrupted, and the reverse direction voltage at a junction between punch-through region 91 and drain region 8 rises. When the depletion layer formed by this reverse direction voltage reaches n-type buffer region 13, i.e., punch-through occurs between n-type buffer region 13 and drain region 8, the electrons in the vicinity of n-type buffer region 13 reach drain region 8 without combining with holes in punch-through region 91. This means that injection of holes h from punch-through region 91 ceases since no holes h are present in punch-through region 91. In addition, since minority carrier injection region 9 enters a floating condition because punch-through region 91 has been depleted, the injection of minority carriers from minority carrier injection region 9 also stops. Therefore, by designing the thickness and impurity concentration of punch-through region 91 so as to punch-through at 2 V to 3 V, the negative resistance which is generated easily in the first embodiment is prevented. A MOSFET operation mode is created as in the first embodiment, thus making high-speed switching possible.

Figure 9:
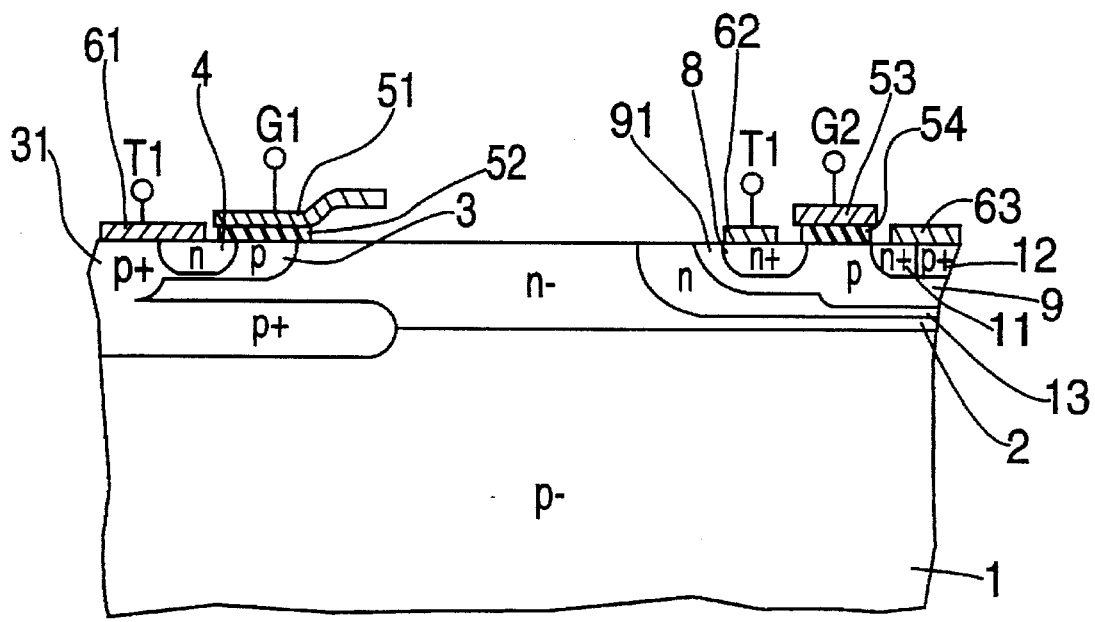
FIG. 9 is a cross section of a semiconductor device according to a fifth embodiment of the present invention having the functions of a horizontal IGBT.

FIG. 9 shows a fifth embodiment of the present invention. The difference between this embodiment and the first embodiment is that the relative positions of drain region 8 and minority carrier injection region 9 are reversed. Because in this embodiment drain region 8 is placed on a side closer to the first gate than in the first embodiment, a plurality of majority carriers are efficiently pulled off $n^-$ layer 2 when p-type punch-through region 91 is punched-through, thereby making high-speed switching possible.

In addition to the above embodiments, the constructional arrangements of the fourth and fifth embodiments can be applied to the MCT as was done in the third embodiment.

Figure 7:
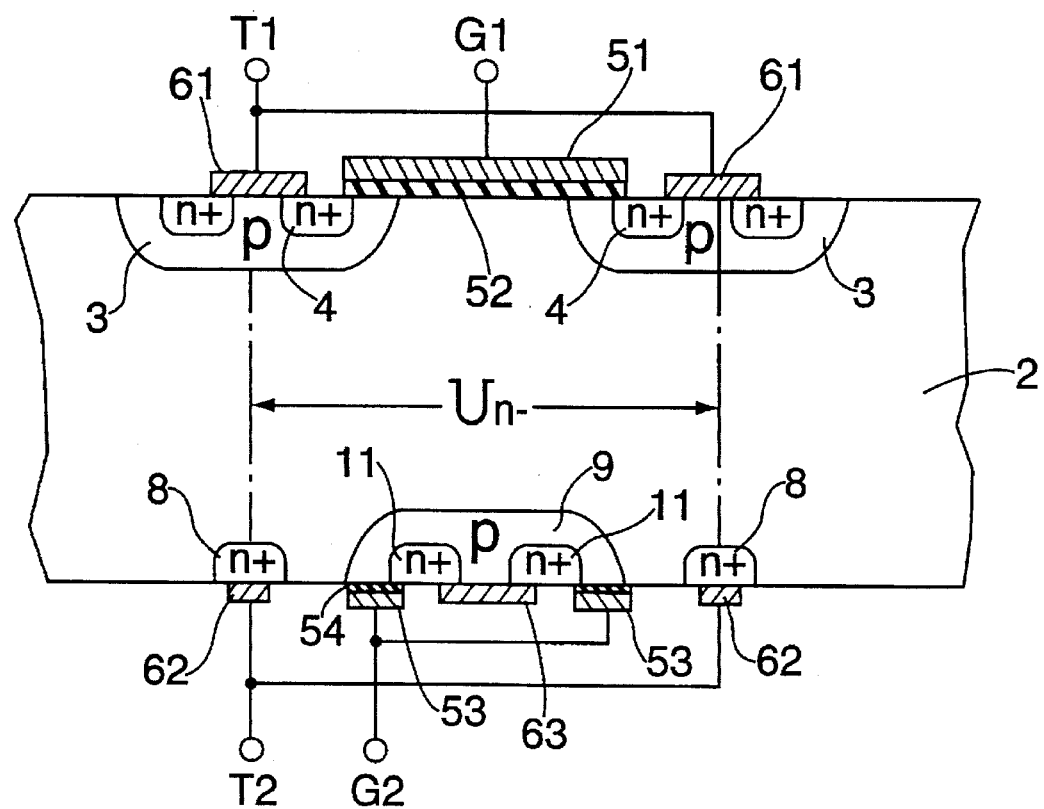
FIG. 7 is a cross section of a semiconductor device according to the third embodiment of the present invention having the functions of a vertical IGBT.

The method causing conductivity modulation by utilizing the minority carrier injection region according to the present invention can be applied to a family of vertical devices in addition to a family of lateral devices. FIG. 7 shows a semiconductor element having the same functions as a vertical IGBT realized in such a manner. The semiconductor is constructed so that p-type base region 3, $n^+$ emitter region 4, and first gate electrode 51 are disposed on one side of $n^-$ layer 2 and emitter electrode 61 contacts p-type base region 3 and $n^+$ emitter region 4. On the other side of $n^-$ layer 2, $n^+$ drain region 8 contacts collector electrode 62. Minority carrier injection region 9, which has minority carrier injecting action, is formed on this other side, as is $n^+$ source region 11 on a surface layer of minority carrier injection region 9. In addition, short-circuit electrode 63, and second gate electrode 53 are formed, thus allowing the same operation as the second embodiment seen in FIG. 4. Vertical configurations for other embodiments are also possible.

Although the above embodiments are explained with an insulated-gate as in an IGFET with a majority carrier injection construction, the theory may be applied to a junction-gate type FET (JFET) having a majority carrier injection construction such as is used in a static induction-type transistor.

Bipolar-type semiconductors such as IGBT's require a long time to turn off because minority carrier injection into a semiconductor region does not stop immediately after the turn-off operation is completed. Given this fact, the present invention installs an injection region for the minority carrier in the semiconductor device which can either be connected to or separated from a drain region. The minority carrier injection region contacts a main electrode via a separate gate. Minority carriers are injected from the injection region connected to the drain region by increasing the voltage applied to a sub-gate during an 'on' operation with a voltage higher than a threshold value. When the turn-off operation is started, minority carrier injection is stopped by separating the injection region from the drain region by decreasing the voltage applied to the subgate to a value lower than the threshold value. As a result, while retaining the advantage of reducing the on-voltage as a result of the on-state conductivity modulation in the semiconductor region, the carders that need to be swept off to allow expansion of a depletion layer in the semiconductor region during a turn-off operation are reduced, thereby substantially reducing the turn-off time, making the turn-off time shorter than in the conventional case, and minimizing the turn-off loss.

The present invention can be widely applied in various patterns to semiconductor devices with a conductivity modulating action such as static inductive thyristors, in addition to the IGBT,s and MCT,s already described. The present invention therefore serves to reduce switching loss, raise the power conversion efficiency, shorten the turn-off time, and expand the applicable frequency range, especially when the invention is applied to semiconductor devices with a high withstand voltage and a large current capacity.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A semiconductor device, comprising:
   a first layer of a first conductivity type on a second layer of a second conductivity type;
   said first layer having a high resistance;
   a drain region of said first conductivity type in a first surface region of said first layer;
   said drain region having a low resistance;
   a first main electrode formed on a surface of said drain region;
   a minority carrier injection region of said second conductivity type formed in a second surface region of said first layer;
   a base region of said second conductivity type formed in a third surface region of said first layer;
   an emitter region of said first conductivity type formed in a surface region of said base region;
   a second main electrode on a surface of said base region and said emitter region;
   a first gate electrode including means for injecting a plurality of majority carriers into said first layer from said emitter region being responsive to a voltage applied to said first gate electrode greater than a first threshold voltage;
   a second gate electrode including means for injecting a plurality of minority carriers into said first layer from said minority carrier injection region and means for injecting a plurality of majority carriers into said drain region responsive to a voltage applied to said second gate electrode greater than a second threshold voltage;
   a source region of said first conductivity type formed in a first surface region of said minority carrier injection region; and
   a floating short-circuit electrode contacting a surface of said minority carrier injection region and a surface of said source region.

2. A semiconductor device according to claim 1, wherein said minority carrier injection region is adjacent to said drain region.

3. A semiconductor device according to claim 1, wherein said minority carrier injection region is spaced apart from said drain region.

4. A semiconductor device according to claim 1, further comprising a buffer region of said first conductivity type; and
   said minority carrier injection region being formed within a surface area of said buffer region.

5. A semiconductor device, comprising:
   a first layer of a first conductivity type on a second layer of a second conductivity type;
   said first layer having a high resistance;
   a drain region of said first conductivity type in a first surface region of said first layer;
   said drain region having a low resistance;
   a first main electrode formed on a surface of said drain region;
   a minority carrier injection region of said second conductivity type formed in a second surface region of said first layer;
   a source region of said first conductivity type formed in a first surface region of said minority carrier injection region;
   a floating short-circuit electrode contacting a second surface region of said minority carrier injection region and a surface of said source region;
   a base region of said second conductivity type in a third surface region of said first layer;
   an emitter region of said first conductivity type in a surface region of said base region;
   a second main electrode on a surface of said base region and said emitter region;
   a first gate oxide film on a surface of said base region, said emitter region being formed within an area of said first gate oxide film;
   a first gate electrode on said first gate oxide film including means for injecting a plurality of majority carriers into said first latter from said emitter region;
   a second gate oxide film on a third surface region of said minority carrier injection region between said source region and said drain region; and
   a second gate electrode on said second gate oxide film including means for injecting a plurality of minority carriers into said first layer from said minority carrier injection region and a plurality of majority carriers into said drain region from said source region responsive to a voltage greater than a first threshold voltage applied to said first gate electrode.

6. A semiconductor device according to claim 5, wherein:
   said first gate electrode extends laterally over said first layer toward said source region;
   said second gate electrode extends laterally over said first layer toward said drain region; and
   said first main electrode extends laterally over said first layer toward said drain region and away from said drain region.

7. A semiconductor device, comprising:
   a first layer of a first conductivity type on a second layer of a second conductivity type;
   said first layer having a high resistance;
   a drain region of said first conductivity type in a first surface region of said first layer;
   said drain region having a low resistance;
   a first main electrode formed on a surface of said drain region;
   a minority carrier injection region of said second conductivity type formed in a second surface region of said first layer;
   means for injecting a plurality of minority carriers into said first layer;
   a source region of said first conductivity type formed in a first surface region of said minority carrier injection region;
   a short-circuit electrode partly on a second surface region of said minority carrier injection region and partly on a surface of said source region;
   a first base region of said second conductivity type in a third surface region of said first layer;
   a second base region of said first conductivity type in a surface region of said first base region;
   an emitter region of said second conductivity type in a surface region of said second base region; a second main electrode on a surface of said second base region and said emitter region;
   a first gate oxide film disposed on a surface of said first base region and said second base region;

a first gate electrode on said first gate oxide film;

a second gate oxide film disposed on a third surface region of said minority carrier injection region between said source region and said drain region; and a second gate electrode on said second gate oxide film.

8. A semiconductor device, comprising:

a first layer of a first conductivity type on a second layer of a second conductivity type;

said first layer having a high resistance;

a buffer region of said first conductivity type formed in a first region of said first layer;

a minority carrier injection region of said second conductivity type formed in a first area of said buffer region;

a punch-through region of said second conductivity type formed in a second area of said buffer region;

said punch-through region and said minority carrier injection region being connected;

a base region of said second conductivity type formed in a third surface region of said first layer;

an emitter region of said first conductivity type formed in a surface region of said base region;

a first gate electrode including means for injecting a plurality of majority carriers into said first layer from said emitter region;

a second gate electrode including means for injecting a plurality of minority carriers into said first layer from said minority injection carrier region;

a source region of said first conductivity type formed in a first surface region of said minority carrier injection region;

said means for injecting a plurality of minority carriers including a floating short-circuit electrode contacting a surface of said minority carrier injection region and a surface of said source region;

a drain region of said first conductivity type formed in an area of said punch-through region; and said drain region having a low resistance.

9. A semiconductor device according to claim 8, wherein said punch-through region has a depth greater than said drain region and less than said minority carrier injection region.

10. A semiconductor device according to claim 8, wherein said punch-through region has a punch-through voltage of 2 V to 3 V.

11. A semiconductor device according to claim 8, further comprising:

a contact region of said second conductivity type in an area between said first layer and said second layer;

said base region in said first layer connected to said contact region;

an emitter electrode on a surface of said contact region and said emitter region;

a gate oxide film disposed on a surface of said emitter region and said base region; and a gate electrode on said gate oxide film.

12. A semiconductor device, comprising:

a first layer of a first conductivity type disposed adjacent a second layer of a second conductivity type;

said first layer having a high resistance;

a drain region of said first conductivity type in a first region of a first surface of said first layer;

said drain region having a low resistance;

a collector electrode formed on a surface of said drain region;

a minority carrier injection region of said second conductivity type formed in a second region of said first surface of said first layer;

means for injecting a plurality of minority carriers from said minority carrier injection region into said first layer;

a source region of said first conductivity type formed in a first surface region of said minority carrier injection region;

a floating short-circuit electrode contacting a second surface region of said minority carrier injection region and a surface of said source region;

a base region of said second conductivity type in a third region of a second surface of said first layer;

an emitter region of said first conductivity type in a surface region of said base region;

an emitter electrode on a surface of said base region and said emitter region;

a first gate oxide film disposed on a fourth region of said second surface of said first layer;

a first gate electrode on said first gate oxide film effective to inject majority carriers from said emitter region into said first layer responsive to a voltage applied to said first gate electrode greater than a first threshold voltage;

a second gate oxide film disposed on a third surface region of said minority carrier injection region; and a second gate electrode on said second gate oxide film;

said means for injecting a plurality of minority carriers being responsive to a voltage applied to said second gate electrode greater than a second threshold voltage.

* * * * *

UNITED STATES PATENT AND TRADEMARK OFFICE
CERTIFICATE OF CORRECTION

PATENT NO. : 5,665,988
DATED : September 9, 1997
INVENTOR(S) : Qin HUANG

It is certified that error appears in the above-identified patent and that said Letters Patent is hereby corrected as shown below:

Column 12, Line 16, Change "latter" to --layer--

Column 12, Lines 49-50, Delete "means for injecting a plurality of minority carriers into said first layer:"

Column 12, Lines 54-55, Change "a short-circuit electrode partly on a second surface region of said minority carrier injection region and partly on a" to
--a floating short-circuit electrode contacting a second surface region of said minority carrier injection region and a--

Column 13, Line 1, Change "a first gate electrode on said first gate oxide film;" to
--a first gate electrode on said first gate oxide film including means for injecting majority carriers into said first layer from said emitter region responsive to a voltage applied to said first gate electrode greater than a first threshold voltage;--

Column 13, Line 5, Change "a second gate electrode on said second gate oxide film." to
--a second gate electrode on said second gate oxide film including means for injecting minority carriers into said first layer responsive to a voltage applied to said second gate electrode greater than a second threshold voltage.--

Signed and Sealed this

Seventeenth Day of February, 1998

Attest:

BRUCE LEHMAN

*Attesting Officer*     *Commissioner of Patents and Trademarks*